United States Patent [19]

Petric et al.

[11] Patent Number: 4,524,261
[45] Date of Patent: Jun. 18, 1985

[54] LOCALIZED VACUUM PROCESSING APPARATUS

[75] Inventors: Paul F. Petric, Swampscott; Michael S. Foley, Beverly, both of Mass.

[73] Assignee: Varian Associates, Inc., Palo Alto, Calif.

[21] Appl. No.: 533,822

[22] Filed: Sep. 19, 1983

[51] Int. Cl.³ .............................................. B23K 15/00
[52] U.S. Cl. ............................ 219/121 EL; 250/441.1
[58] Field of Search ................. 219/121 EL, 121 EN, 219/121 EB, 121 EM; 250/441.1, 492.2

[56] References Cited

U.S. PATENT DOCUMENTS

| | | | |
|---|---|---|---|
| 2,899,556 | 8/1959 | Schopper et al. | 250/441.1 |
| 3,156,811 | 11/1964 | Barry | 219/121 |
| 3,388,235 | 6/1968 | Pinsley et al. | 219/121 |
| 3,401,249 | 9/1968 | Schleich et al. | 219/121 EN X |
| 3,426,173 | 2/1969 | Steigerwald | 219/121 EN X |
| 4,191,385 | 3/1980 | Fox | 277/3 |
| 4,342,900 | 8/1982 | Susei et al. | 219/121 EN |
| 4,358,657 | 11/1982 | Steigerwald et al. | 219/121 EN |

FOREIGN PATENT DOCUMENTS 2023336A 12/1979 United Kingdom .
2027271A 2/1980 United Kingdom .

OTHER PUBLICATIONS

Lewis et al., "A Laser Interferometer Controlled X,Y Air Bearing for Direct Wafer Exposure Electron Beam Lithography," *Proc. 10th Int. Conf. on Electron and Ion Beam Science and Technology*, p. 477, (1982).

Fox, "Planar Vacuum Seal for Isolating an Air Bearing," U.S. Ser. No. 107,207, filed Dec. 16, 1979, (Corresponding PCT Appl. No. US80/01718, published Jul. 8, 1982).

*Primary Examiner*—C. L. Albritton
*Attorney, Agent, or Firm*—Stanley Z. Cole; William R. McClellan

[57] ABSTRACT

Localized vacuum envelope apparatus includes a housing member having a bottom plate with a downwardly extending first sleeve and an upwardly extending flange. The flange includes ports for vacuum pumping and is adapted for attachment to an electron beam column. The apparatus further includes a lower plate having a second downwardly extending sleeve and an upper plate having a third downwardly extending sleeve. The first, second and third sleeves, which can have a truncated conical shape and are concentric, define vacuum zones. Channels are provided for connecting the vacuum zones to individual ports. The tips of the sleeves are coplanar and form the tip of the vacuum envelope. A noncontacting graded vacuum seal is formed between the tip of the vacuum envelope and a workpiece. The housing member and the upper plate can be ferromagnetic material to provide double magnetic shielding.

25 Claims, 10 Drawing Figures

LOCALIZED VACUUM PROCESSING APPARATUS

GOVERNMENT RIGHTS

The Government has rights in this invention pursuant to Contract No. F19628-80-C-0173 awarded by the Department of the Air Force.

BACKGROUND OF THE INVENTION

This invention relates to localized vacuum processing of a workpiece and, more particularly, to a localized vacuum envelope structure suitable for use in an electron beam lithography system.

Particle beam systems, such as ion implanters, electron beam lithography systems and ion beam lithography systems, require evacuation of the region along the path between the particle beam source and the workpiece being treated. The workpiece is introduced into the vacuum chamber, either directly or through an air lock. Such systems are highly complex and expensive. In addition, the vacuum pumping time causes a reduction in overall processing speed, a factor of utmost importance in a commercial semiconductor processing environment. These problems have been alleviated by the development of localized vacuum processing, as described hereinafter.

Certain particle beam processes require movement of the workpiece during processing. In electron beam lithography, microminiature patterns of extremely high accuracy are exposed on a workpiece. To achieve high accuracy, the electron beam deflection field is limited to an area much smaller than the area of the workpiece. Typically, an electron beam deflection field is a few millimeters on a side, while the workpiece, usually a semiconductor wafer or a mask plate, can be several inches in dimension. In order to expose the entire workpiece, precise positioning of the workpiece with respect to the electron beam is required.

Apparatus for vacuum porcessing in a localized region on the surface of a workpiece is disclosed in pending application Ser. No. 435,179, filed Oct. 19, 1982, and assigned to the assignee of the present invention. The vacuum processing apparatus includes an envelope which defines an internal vacuum processing zone. The tip of the envelope is positioned just above the surface of the workpiece and is spaced from the workpiece by a preselected gap. The tip of the envelope, together with the workpiece, forms a noncontacting graded vacuum seal between the internal vacuum processing zone and the ambient environment. The vacuum envelope provides a vacuum zone on the surface of the workpiece which is small in comparison with the size of the workpiece.

In order to treat the entire surface of the workpiece, the workpiece is mounted on a stage which is movable laterally with respect to the tip of the envelope. To achieve rapid processing in electron beam lithography systems, stage speeds of between and 1 and 10 cm/sec are typically employed. During this movement, the gap between the tip of the envelope and the workpiece must be dynamically controlled within specified limits. If the gap becomes too large, the vacuum in the vacuum zone is reduced, and the processing is interrupted until the required vacuum level can again be achieved. Electron beam columns used in lithography systems must be operated in the mid to high vacuum range. Typically, inadequate space is available to provide high conductance vacuum pumping. In such cases, the gap must be relatively small. When high conductance vacuum pumping can be provided, or lower pressure can be tolerated by the process, a larger gap is permitted. Conversely, the gap cannot become so small as to risk contact between the tip of the envelope and the workpiece. A workpiece, such as a semiconductor wafer, is extremely fragile and can be permanently damaged or broken by such contact. A charged particle beam system providing lateral movement of the workpiece during localized vacuum processing is disclosed in pending application Ser. No. 435,178, while a gap control system for localized vacuum processing is disclosed in pending application Ser. No. 435,177, both of which applications were filed Oct. 19, 1982, and assigned to the assignee of the present invention.

A critical factor in achieving practical localized vacuum processing is the structure of the vacuum envelope apparatus. The tip portion of the apparatus, which forms a noncontacting seal with the wafer, must be as small in area as practical, consistent with the size of the electron beam deflection field. This is necessary to permit processing near the edge of the wafer without losing vacuum as well as allowing the use of a vacuum chuck to hold the wafer rigid and flat. In the case of an electron beam lithography system, the vacuum envelope apparatus should have a small dimension in the direction along the axis of the beam. This requirement is necessary to avoid undue lengthening of the electron beam path and focal length of the final lens, both of which would cause an increased beam aberration. Furthermore, when the envelope apparatus has a small dimension along the path of the beam, the vacuum level in the processing zone is less critical. If the electron beam passes through a region of lower vacuum over a small percentage of its total path length, the effect on the beam is minimal. Another requirement is that a maximum amount of conductance be provided between the tip of the vacuum envelope and each of the vacuum pumps to which the apparatus is connected. This is difficult to achieve because of the small dimensions of the vacuum envelope, particularly the tip. The apparatus should not include structural members which obstruct gas flow, particularly in the region near the tip where gas flow is most restricted. A desirable feature of the envelope apparatus is that it provide magnetic shielding between the workpiece and the magnetic elements of the electron beam column. When such shielding is provided, the shield should be symmetrical about the beam axis to prevent deflection or aberration of the electron beam as it passes through the vacuum envelope. Finally, the vacuum envelope apparatus should be simple and inexpensive to construct.

It is a general object of the present invention to provide a novel localized vacuum envelope apparatus.

It is another object of the present invention to provide a localized vacuum envelope apparatus suitable for use in an electron beam lithography system.

It is yet another object of the present invention to provide a localized vacuum envelope apparatus which has a small dimension along a beam axis and which has a small area tip portion.

It is still another object of the present invention to provide a localized vacuum envelope apparatus with the capability to achieve a relatively high vacuum zone.

SUMMARY OF THE INVENTION

According to the present invention, these and other objects and advantages are achieved in apparatus adapted for attachment to a vacuum processing chamber for localized vacuum processing of a workpiece. The apparatus comprises a housing member including a bottom plate with a downwardly extending first sleeve having an aperture therethrough and an upwardly extending flange around the periphery of the bottom plate. The flange includes a plurality of ports for vacuum pumping. The bottom plate and the flange in combination define an interior region of the housing member. The apparatus further comprises a lower plate mounted in the interior region of the housing member with a second sleeve extending downwardly into the aperture and having a tip coplanar with the tip of the first sleeve, such that a first vacuum zone is defined between the first sleeve and the second sleeve. The first vacuum zone is in gas communication with one of the ports through a channel between and defined by a cutout portion in one or both of the housing member and the lower plate. In a preferred embodiment, the apparatus further includes an upper plate mounted above the lower plate in the interior region of the housing member with a third sleeve extending downwardly into the aperture and having a tip coplanar with the tips of the first and second sleeves such that a second vacuum zone is defined between the second sleeve and the third sleeve, and a central high vacuum zone is defined inside the third sleeve. The second vacuum zone is in gas communication with another of the ports through a channel between and defined by a cutout portion in one or both of the lower plate and the upper plate. The high vacuum zone is in gas communication with still another one of the ports through the portion of the interior region above the upper plate. According to a feature of the invention, each of the sleeves has a truncated conical shape. According to another feature of the present invention, the housing member, the lower plate and the upper plate are coupled together by brazing or a suitable adhesive material to insure vacuum-tight sealing of the first and second vacuum zones and the high vacuum zone.

BRIEF DESCRIPTION OF THE DRAWINGS

For a better understanding of the present invention, together with other and further objects, advantages and capabilities thereof, reference may be had to the accompanying drawings which are incorporated herein by reference and in which.

DETAILED DESCRIPTION OF THE INVENTION

Figure 1:
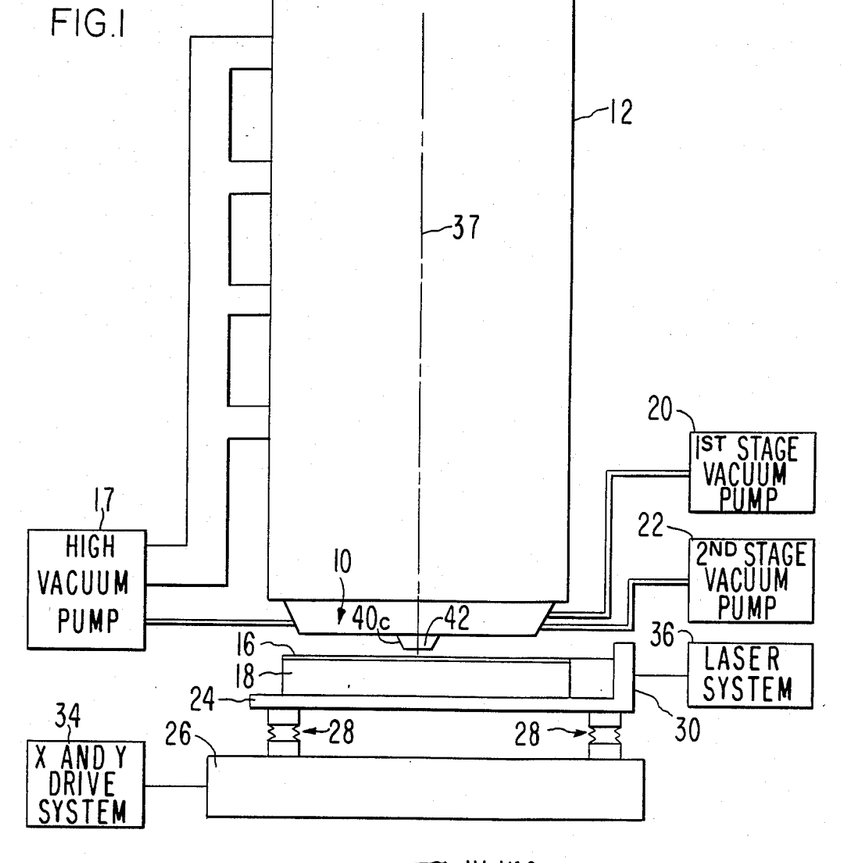
FIG. 1 is a schematic block diagram of an electron beam exposure system incorporating apparatus in accordance with the present invention.

Particle beam apparatus incorporating localized vacuum processing of a workpiece is illustrated in block diagram form in FIG. 1. An electron beam lithography system includes a localized vacuum envelope apparatus 10 mounted to the output of an electron beam column 12 which includes an electron source, demagnification optics and projection and deflection optics. The column 12 also includes illumination and shaping optics when a shaped beam is utilized. A preferred electron beam column 12 is described in pending application Ser. No. 354,822, filed Mar. 4, 1982. Other suitable electron beam columns are known in the art. The output of the column 12 is a finely focused electron beam 14 (FIG. 2) which passes through the envelope apparatus 10 and impinges on a workpiece such as a semiconductor wafer 16. The entire region traversed by the electron beam 14 between the electron source and the wafer is maintained at high vacuum on the order of $10^{-6}$ Torr by a high vacuum pump 17 coupled to the column 12. It will be understood by those skilled in the art that in a practical system the electron optical elements are located outside the vacuum region and a central tube traversed by the electron beam 14 is maintained at high vacuum. The envelope apparatus 10 is coupled to a first stage vacuum pump 20 and to a second stage vacuum pump 22 and to the high vacuum pump 17. The wafer 16 is supported and held in position by a vacuum chuck 18 mounted on a stage 24. The stage 24 is supported above an x-y table by actuators 28 and includes mirror surfaces 30, to which the vacuum chuck 18 is rigidly coupled, for exact measurement of the x-y position of the wafer 16. Wafers are placed on the vacuum chuck 18 and removed therefrom by an automated wafer handling system (not shown). The x-y table 26 is translated in the x-y plane by an x-y drive system 34. The exact x-y position of the wafer 16 is sensed by a laser interferometer system 36 which directs optical signals at mirror surfaces 30. It will be understood that the z-axis 37 coincides generally with the path of the electron beam 14 while the x and y axes form a plane perpendicular to the z-axis 37 in which the wafer 16 is moved. The complete electron beam lithography system further includes a controller or computer and associated electronic system (not shown in FIG. 1) which controls the column 12, the drive system 34, the vacuum system and the wafer handling system and which stores pattern data and provides beam control signals.

Figure 2:
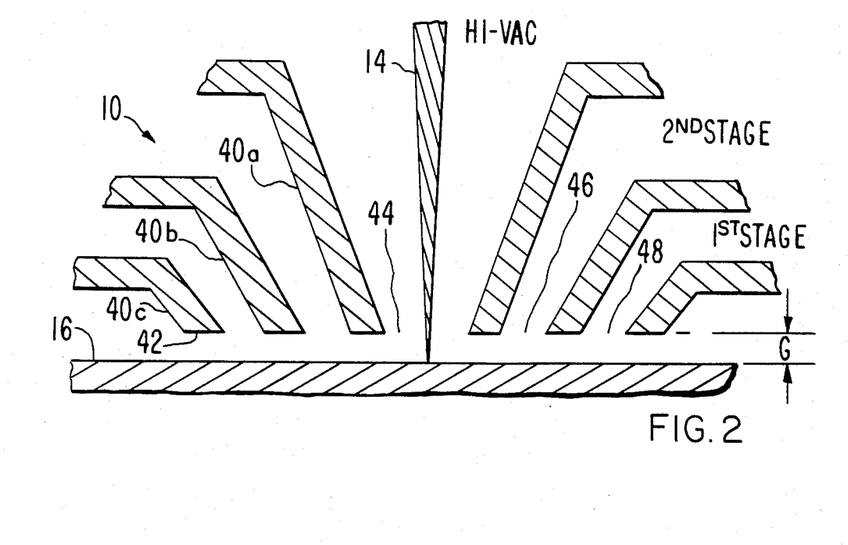
FIG. 2 is an enlarged cross-sectional view of the localized vacuum envelope apparatus illustrated in FIG. 1.

The tip of the envelope apparatus 10 and the surface of the wafer 16 are illustrated in an enlarged cross-sectional view in FIG. 2. The envelope apparatus 10 includes concentric sleeve members 40a, 40b, 40c, each of which can have a truncated conical shape and includes a tip 42 formed by coplanar positioning of the tips of the sleeve members 40a, 40b, 40c. The tip 42 is positioned during processing slightly above the wafer 16. A gap G, typically on the order of about 30 micrometers, is defined between the tip 42 and the surface of the wafer 16. The sleeve member 40a defines a high vacuum processing zone 44. During operation, a differential pumping arrangement forms a graded vacuum seal in the gap region between the vacuum zone 44 and the ambient environment. An annular aperture 46 concentric with the high vacuum zone 44 is defined between sleeve members 40a and 40b; an annular aperture 48 also concentric with the high vacuum zone 44 is defined between the members 40b and 40c. The annular aperture 48 is coupled to the first stage vacuum pump 20 which reduces the pressure around the high vacuum zone 44 to a low vacuum level and produces a first vacuum zone. The annular aperture 46 is coupled to the second stage vacuum pump 22 which reduces the pressure around the high vacuum zone 44 to an intermediate vacuum level and produces a second vacuum zone. The high vacuum zone 44 is coupled to the high vacuum pump 17. Depending on the pressure required in a particular process, more or fewer vacuum pumping stages can be utilized to form a graded seal. Typically, the outer diameter of the tip 42 for direct write electron beam lithography is about 10–15 millimeters, while the diameter of the high vacuum zone 44 is about 3–5 millimeters. When the tip 42 of the envelope apparatus 10 is placed in close proximity to the surface of the wafer 16, a high vacuum is maintained in the high vacuum zone 44. As the wafer 16 is moved beneath the envelope apparatus 10, the electron beam 14 is scanned over a region of the wafer surface within the high vacuum zone 44. Additional information on the localized envelope apparatus is given in pending application Ser. No. 435,179.

Figure 3A:
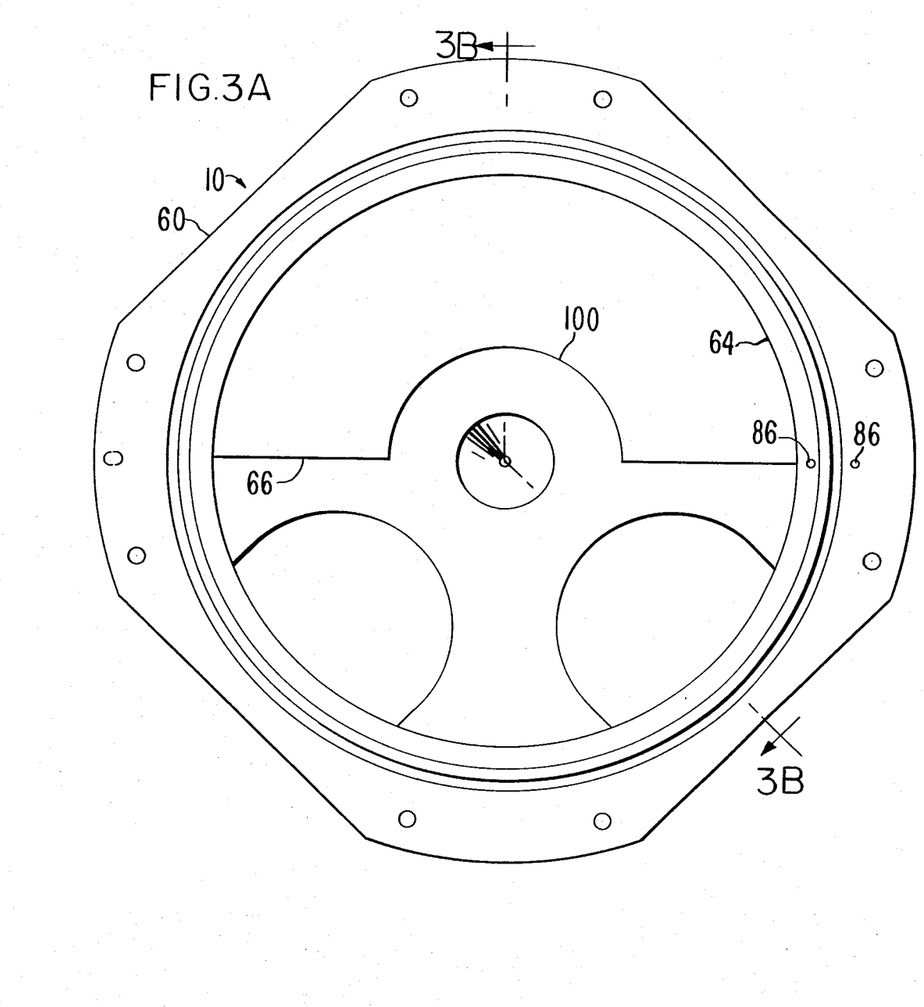
FIGS. 3A and 3B are top and cross-sectional views, respectively, of the envelope apparatus in accordance with the present invention.
Figure 3B:
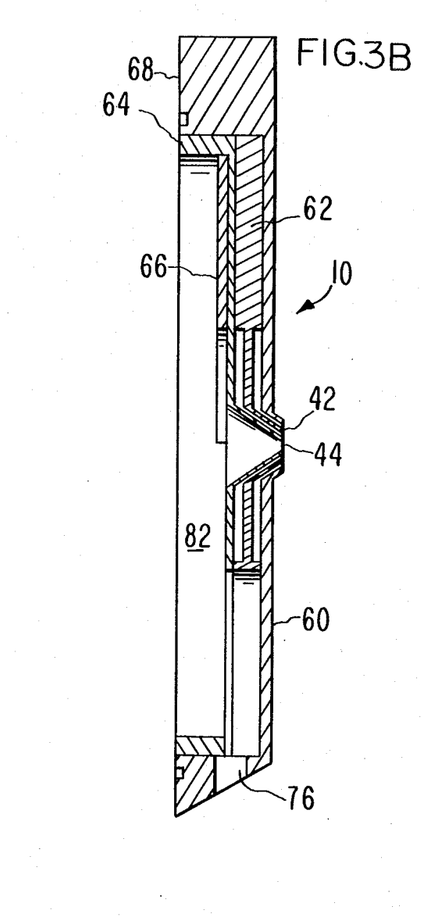
Figure 4A:
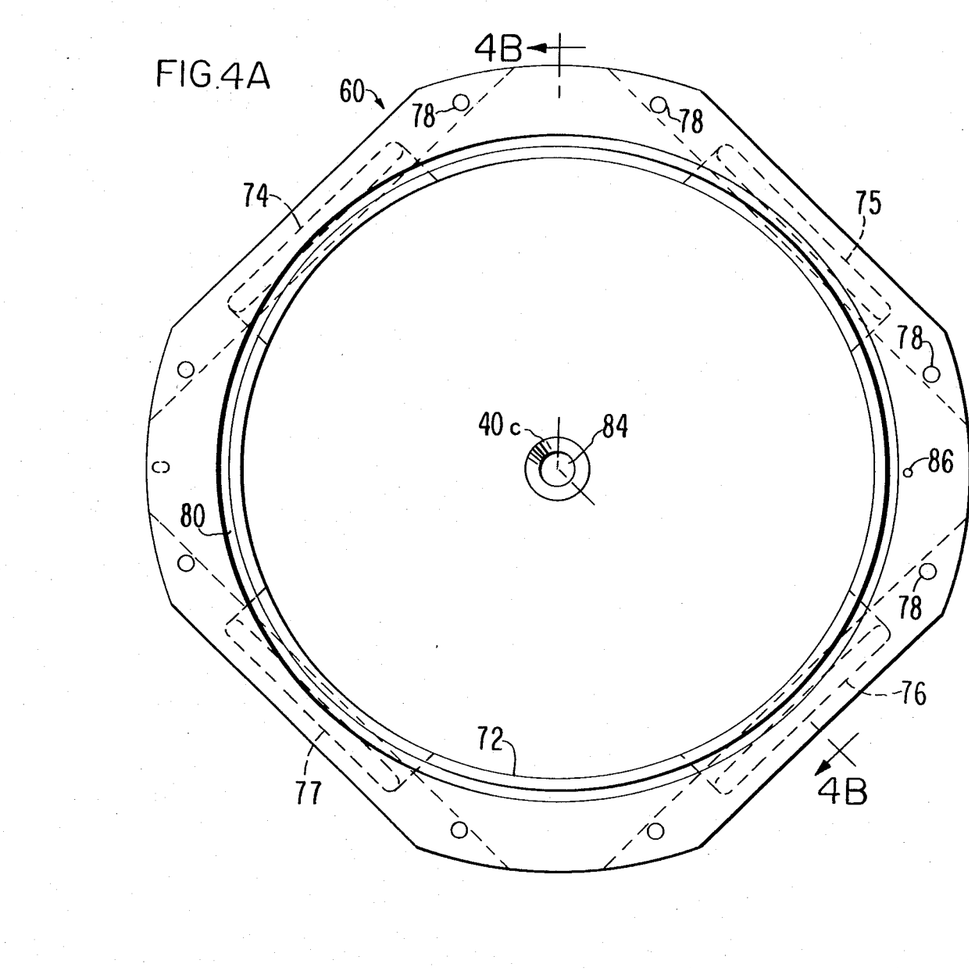
FIGS. 4A and 4B are top and cross-sectional views, respectively, of the housing member of the envelope apparatus.
Figure 4B:
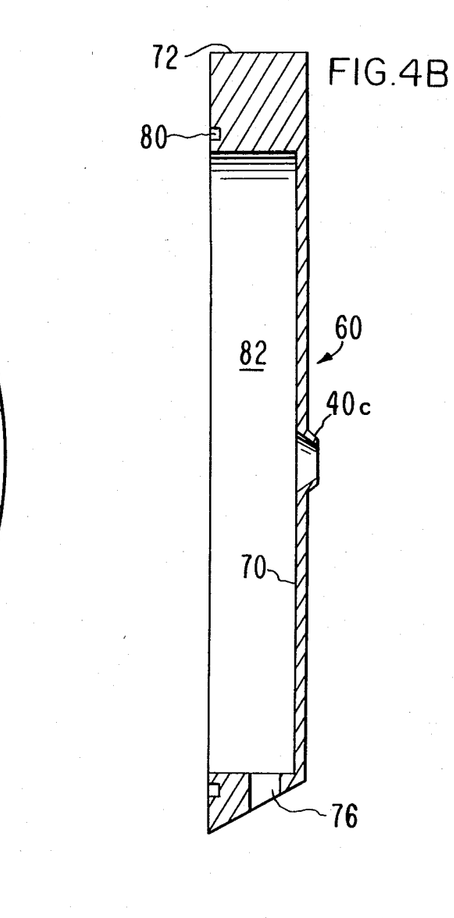
Figure 5A:
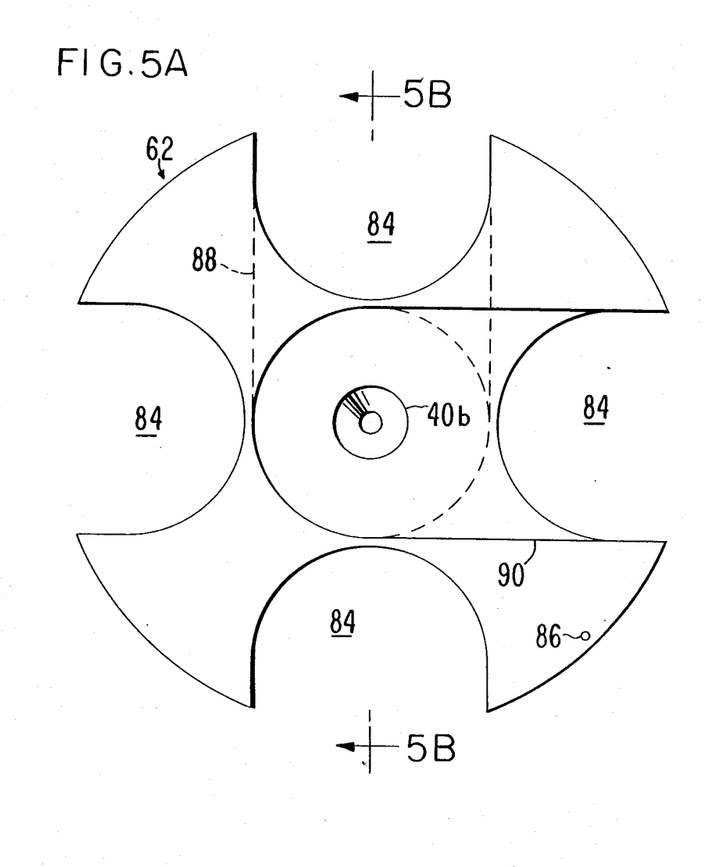
FIGS. 5A and 5B are top and cross-sectional views, respectively, of the lower plate of the envelope apparatus.
Figure 5B:
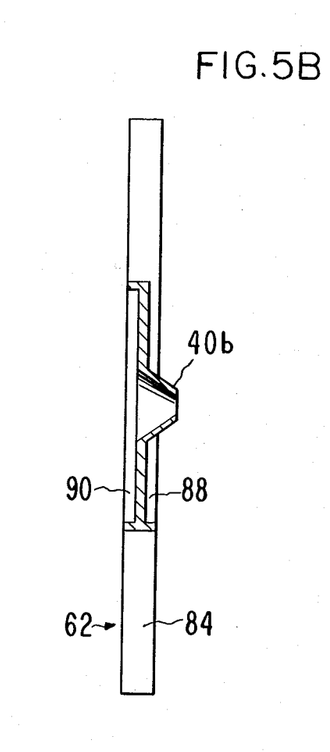
Figure 6A:
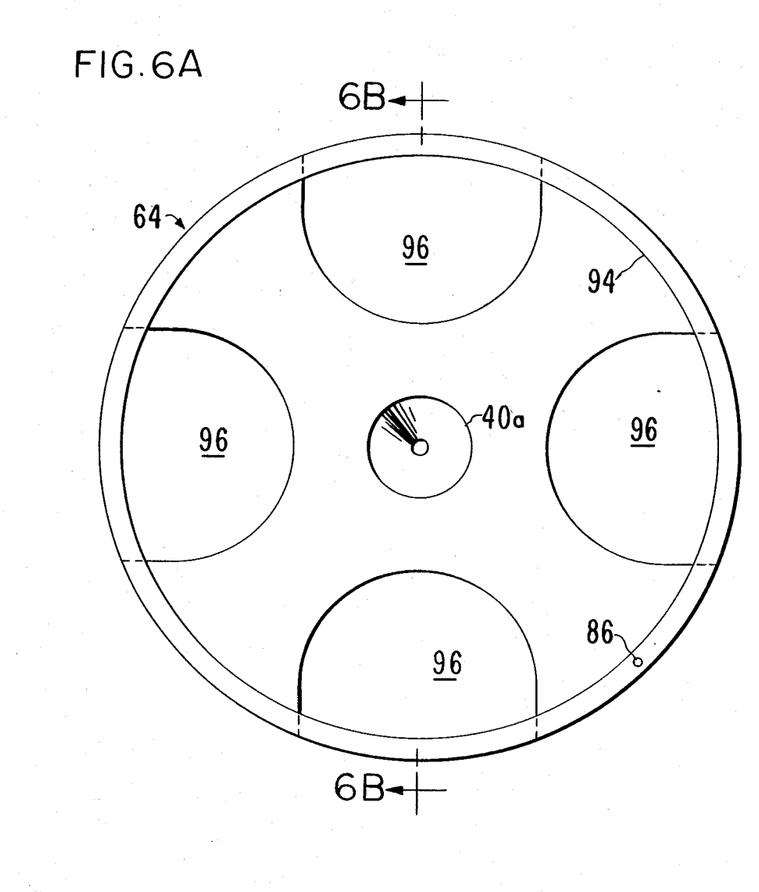
FIGS. 6A and 6B are top and cross-sectional views, respectively, of the upper plate of the envelope apparatus.
Figure 6B:
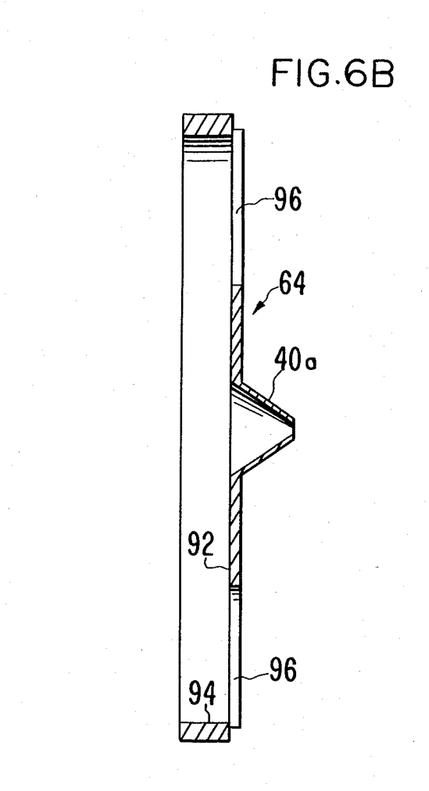

The construction of the localized vacuum envelope apparatus 10, in accordance with the present invention, is shown in detail in FIGS. 3–6. The assembled envelope apparatus 10 is shown in FIG. 3, while individual elements of the envelope apparatus are shown in FIGS. 4–6. A top view of the assembled envelope apparatus is shown in FIG. 3A; FIG. 3B is a cross-sectional view through the line 3B—3B of FIG. 3A. The envelope apparatus 10 includes a housing member 60 in which a lower plate 62, an upper plate 64 and a blankoff plate 66 are mounted. An upper surface 68 of the envelope apparatus 10 is adapted for attachment to the electron beam column 12 such that the electron beam 14 passes through the tip 42. The tip 42 of the envelope apparatus 10 extends downwardly from the main portion thereof and forms a noncontacting seal with the workpiece. Connections to vacuum pumps 17, 20 and 22 are made to the envelope apparatus 10 around the periphery thereof, as described hereinafter.

Referring now to FIGS. 4A and 4B, the housing member 60 includes a generally flat bottom plate 70 and an upwardly extending flange 72 around the periphery of the bottom plate 70. The flange 72 is provided with a plurality of ports 74, 75, 76, 77 adapted for connection through appropriate conduits to vacuum pumps 17, 20, 22. The flange 72 is further provided with a plurality of mounting holes 78 and an O-ring groove 80 for mounting the housing member 60 vacuum-tight to the electron beam column 12. The portions of the flange 72 adjacent the ports 74, 75, 76, 77 are angled downwardly and inwardly, as shown in FIG. 4B, to facilitate assembly and disassembly of the envelope apparatus 10 to the vacuum pumping system. The bottom plate 70 and the flange 72 in combination define a cylindrical interior region 82 of the housing member 60. The sleeve 40c, having a truncated conical shape, extends downwardly from the center of the bottom plate 70. The sleeve 40c defines an aperture 84 through the bottom portion of the housing member 60.

The lower plate 62 is mounted in the lower portion of the housing member 60, as shown in FIG. 3B. Referring now to FIGS. 5A and 5B, the lower plate 62 has a generally circular outline adapted for mounting in the interior region 82 and includes the downwardly extending sleeve 40b having a truncated conical shape and positioned to fit within the sleeve 40c. The lower plate 62 further includes a plurality of cutouts 84 which are radially aligned with and provide unobstructed regions around the ports 74, 75, 76, 77 in the housing member 60. The housing member 60 and the plates 62, 64 are properly aligned when alignment holes 86 on each of the elements are radially aligned. A channel 88 is cut in the bottom surface of the lower plate 62 between the exterior of the sleeve 40b and one of the cutouts 84 at the periphery of the lower plate 62. A channel 90 is cut in the top surface of the lower plate 62 between the interior of the sleeve 40b and another of the cutouts 84.

With reference to FIGS. 6A and 6B, the upper plate 64 includes a generally flat bottom plate 92 and the downwardly extending sleeve 40a, having a truncated conical shape. The upper plate 64 further includes an upwardly extending flange 94 around the periphery of the bottom plate 92 and a plurality of cutouts 96 which are aligned with the cutouts 84 on the lower plate 62. The sleeve 40a is positioned to fit within the sleeve 40b of the lower plate 62.

The blankoff plate 66, as shown in FIGS. 3A and 3B, is a flat semicircular disk with a semicircular cutout 100 in its center. The blankoff plate 66 seals two of the cutouts 96 in the upper plate 64 vacuum tight. The non-ferromagnetic blankoff plate 66 is required when the upper plate 64 is a ferromagnetic material so that axially symmetric magnetic properties can be obtained.

The envelope apparatus 10 is assembled with the lower plate 62, the upper plate 64 and the blankoff plate 66 positioned in the housing member 60 as shown in FIGS. 3A and 3B with the alignment holes 86 radially aligned. Brazing foil is placed between contacting surfaces. The assembly is then heated to a temperature sufficient to melt the brazing foil and cause all of the contacting surfaces to be brazed together. The brazing insures that the various vacuum passages are sealed vacuum-tight. In an alternative assembly technique, an adhesive such as epoxy is used between contacting surfaces to provide vacuum-tight seals. The sleeves 40a, 40b, 40c are concentric; and the tips thereof are positioned in a plane to form the tip 42 of the envelope apparatus 10. The vacuum zone 44 is defined by the sleeve 40a. The annular aperture 46, or second vacuum zone, is concentric with the vacuum zone 44 and is defined by the sleeves 40a and 40b. The annular aperture 48, or first vacuum zone, is concentric with the vacuum zone 44 and is defined by the sleeves 40b and 40c.

In operation, the first stage vacuum pump 20 is coupled by appropriate conduit to the port 74 (FIG. 4A). The annular aperture 48 is coupled through the channel 88 (FIGS. 5A and 5B) between the lower plate 62 and the housing member 60 to the port 74. The second stage vacuum pump 22 is coupled to the port 75 (FIG. 4A). The annular ring 46 is coupled through the channel 90 (FIGS. 5A and 5B) between the lower plate 62 and the upper plate 64 to the port 75. The high vacuum pump 17 is coupled by an appropriate conduit to the port 76 (FIG. 4A). The vacuum zone 44 is coupled through the interior region 82 of the housing member 60 above the upper plate 64 to the port 76, as best shown in FIG. 3B. Thus, there is provided during operation, when the tip 42 is positioned just above a workpiece, a graded vacuum seal in the gap region between the vacuum zone 44 and the ambient environment. As noted above, more or fewer vacuum pumping stages can be utilized depending on the required vacuum level in the zone 44. An additional stage can be coupled to a vacuum pump through the port 77. Alternatively, the high vacuum pump 17 can be coupled to the port 77, thereby providing additional conductance between the vacuum zone 44 and the vacuum pump 17.

The housing member 60 is typically fabricated from ferromagnetic material such as electrical iron and performs a magnetic shielding function between the magnetic elements of the electron beam column 12 and the workpiece 16. In a preferred embodiment, the lower plate 62 is titanium, a nonmagnetic material, and the upper plate 64 is electrical iron. The envelope apparatus 10 thereby provides double magnetic shielding. The magnetic shielding elements 60, 64 are generally symmetrical about the electron beam axis, so as to avoid affecting the beam as it passes through the envelope apparatus 10. Two of the cutouts 96 on the upper plate 64 have no function other than to insure a symmetrical configuration. The blankoff plate 66 is nonmagnetic material and, seals the nonfunctional cutouts 96.

As noted hereinabove, when the vacuum process permits a lower vacuum level or space permits higher conductance vacuum pumping, the number of vacuum pumping stages in the envelope apparatus can be reduced. With reference to FIGS. 3A and 3B, the disclosed envelope apparatus can be reduced to two stages by eliminating the upper plate 64, providing a suitable blankoff plate to seal the unused ports and scaling the remaining sleeves 40b, 40c to the desired dimension.

While the sleeves 40a, 40b, 40c have been shown and described as having a truncated conical shape, it will be understood that other shapes, such as, for example, cylindrical sleeves, can be utilized. Furthermore, the vacuum zone 44 is not necessarily circular but can be elongated or otherwise arbitrarily shaped, as required by a particular vacuum process.

In one example of a localized vacuum envelope apparatus, in accordance with the present invention, the dimension of the envelope apparatus along the electron beam axis is about 1.25 inches. The outer diameter of the tip is about 0.5 inch. The vacuum achieved in the high vacuum zone 44 is about $1 \times 10^{-5}$ Torr with a gap between the tip and the workpiece of about 20 micrometers.

Where there has been shown and described what is at present considered the preferred embodiments of the invention, it will be obvious to those skilled in the art that various changes and modifications may be made therein without departing from the scope of the invention as defined by the appended claims.

We claim:

1. Apparatus adapted for attachment to a vacuum processing chamber for localized vacuum processing of a workpiece, said apparatus comprising:
   a housing member including a bottom plate with a downwardly extending first sleeve having an aperture therethrough and an upwardly extending flange around the periphery of said plate, said flange including a plurality of ports for vacuum pumping, said bottom plate and said flange in combination defining an interior region of said housing member;
   a lower plate mounted in said interior region of said housing member with a second sleeve extending downwardly into said aperture inside said first sleeve and having a tip coplanar with the tip of said first sleeve such that a first vacuum zone is defined between said first sleeve and said second sleeve and said first vacuum zone is in gas communication with a first one of said ports through a channel between said housing member and said lower plate; and
   an upper plate mounted above said lower plate in said interior region of said housing member with a third sleeve extending downwardly into said aperture inside said second sleeve and having a tip coplanar with the tips of said first and second sleeves such that a second vacuum zone is defined between said second sleeve and said third sleeve and a high vacuum zone is defined inside said third sleeve, said second vacuum zone being in gas communication with a second one of said ports through a second channel between said lower plate and said upper plate and said high vacuum zone being in gas communication with a third one of said ports through the portion of said interior region above said upper plate.

2. The apparatus as defined in claim 1 wherein said first sleeve, said second sleeve and said third sleeve each have a truncated conical shape.

3. The apparatus as defined in claim 2 wherein said first vacuum zone and said second vacuum zone are unobstructed by structural members thereby providing relatively high vacuum conductance.

4. The apparatus as defined in claim 1 wherein said flange on said housing member includes means for mounting said apparatus to said processing chamber and for providing a vacuum seal between said apparatus and said processing chamber.

5. The apparatus as defined in claim 1 wherein said housing member is fabricated from ferromagnetic material to provide magnetic shielding between the processing chamber and the workpiece.

6. The apparatus as defined in claim 5 wherein said upper plate is fabricated from ferromagnetic material and said lower plate is fabricated from low permeability material in order to provide double magnetic shielding between the processing chamber and the workpiece.

7. The apparatus as defined in claim 6 adapted for passage of a charged particle beam through said high vacuum zone to said workpiece, said housing member and said upper plate being generally symmetrical about a central axis of said high vacuum zone in order to minimize interaction with said charged particle beam.

8. The apparatus as defined in claim 7 constructed by brazing of contacting surfaces of said housing member, said lower plate and said upper plate.

9. The apparatus as defined in claim 7 constructed by sealing contacting surfaces of said housing member, said lower plate and said upper plate with an adhesive material.

10. The apparatus as defined in claim 1 wherein said interior region of said housing member has a generally cylindrical shape and said first, second and third sleeves are centrally located therein.

11. The apparatus as defined in claim 10 adapted for attachment to an electron beam lithography column.

12. Apparatus adapted for attachment to a vacuum processing chamber for localized vacuum processing of a workpiece, said apparatus comprising:
   a housing member including a bottom plate with a downwardly extending first sleeve having an aperture therethrough and an upwardly extending flange around the periphery of said plate, said flange including a plurality of ports for vacuum pumping, said bottom plate and said flange in combination defining an interior region of said housing member; and a lower plate mounted in said interior region of said housing member with a second sleeve extending downwardly into said aperture and having to tip coplanar with the tip of said first sleeve such that a first vacuum zone is defined between said first sleeve and said second sleeve and a high vacuum zone is defined inside said second sleeve, said first vacuum zone being in gas communication with one of said ports through a channel between said housing member and said lower plate and said high vacuum zone being in gas communication with another of said ports through the portion of said interior region above said lower plate.

13. Apparatus as defined in claim 1 further including means coupled to said ports for evacuating said first vacuum zone, said second vacuum zone and said high vacuum zone.

14. Apparatus as defined in claim 12 further including means coupled to said ports for evacuating said first vacuum zone and said high vacuum zone.

15. Apparatus for localized vacuum processing of a workpiece, said apparatus comprising:
a first housing portion defining a vacuum chamber and means for evacuating said chamber;
a second housing portion including a bottom plate with a downwardly extending first sleeve having an aperture therethrough and an upwardly extending peripheral flange, said flange including a first port for vacuum pumping; and
a lower plate mounted in said second housing portion with a second sleeve extending downwardly into said aperture and having a tip coplanar with the tip of said first sleeve such that a first vacuum zone is defined between said first sleeve and said second sleeve, said first vacuum zone being in gas communication with said first port through a conduit between said housing member and said lower plate and a high vacuum zone is defined inside said second sleeve, said high vacuum zone being in gas communication with said vacuum chamber such that a vacuum region extends from said vacuum chamber through said high vacuum zone to a portion of the surface of said workpiece.

16. Apparatus as defined in claim 15 wherein said high vacuum zone is in gas communication with a second port in said flange.

17. Apparatus as defined in claim 16 further including first vacuum pumping means coupled to said first port for evacuation of said first vacuum zone, and
second vacuum pumping means coupled to said second port for evacuation of said high vacuum zone.

18. Apparatus for localized vacuum processing of a workpiece, said apparatus comprising:
a first housing portion defining a vacuum chamber and means for evacuating said chamber;
a second housing portion including a bottom plate with a downwardly extending first sleeve having an aperture therethrough and an upwardly extending peripheral flange, said flange including ports for vacuum pumping;
a lower plate mounted in said second housing portion with a second sleeve extending downwardly into said aperture inside said first sleeve and having a tip coplanar with the tip of said first sleeve such that a first vacuum zone is defined between said first sleeve and said second sleeve and said first vacuum zone is in gas communication with a first one of said ports through a conduit between said second housing portion and said lower plate; and an upper plate mounted above said lower plate in said second housing portion with a third sleeve extending downwardly into said aperture inside said second sleeve and having a tip coplanar with the tips of said first and second sleeves such that a second vacuum zone is defined between said second sleeve and said third sleeve, said second vacuum zone being in gas communication with a second one of said ports through a second conduit between lower plate and said upper plate and a high vacuum zone is defined inside said third sleeve, said high vacuum zone being in gas communication with said vacuum chamber and with a third one of said ports, such that a vacuum region extends from said vacuum chamber through said high vacuum zone to a portion of the surface of said workpiece.

19. Apparatus as defined in claim 18 further including first vacuum pumping means coupled to said first port for evacuation of said first vacuum zone,
second vacuum pumping means coupled to said second port for evacuation of said second vacuum zone, and
third vacuum pumping means coupled to said third port for evacuation of said high vacuum zone.

20. Apparatus as defined in claim 18 wherein said lower plate and said upper plate include cutout portions adjacent said ports and said apparatus further includes a blankoff plate positioned in said second housing portion above said upper plate for isolating said first and said second ports from said high vacuum zone.

21. Apparatus for providing a graded radial vacuum in a gap through which a particle beam propagates along a longitudinal axis from the interior of a high vacuum envelope containing a source of the beam to a workpiece that is maintained at atmospheric pressure except for an area exposed to the graded radial vacuum, the apparatus comprising plural nested solid members having concentric sleeves with coplanar tips, the sleeves being coaxial with the beam axis at different radii from the beam axis to define plural fluid flow passages concentric with the beam axis, the coplanar tips being equispaced from the workpiece to define the gap, each solid member having a surface portion extending radially away from the beam axis, adjacent ones of said surface portions of different solid members defining a radially extending fluid conduit from the outer concentric fluid flow passage, the outermost one of said members having a wall carried by the envelope and supporting the remainder of said members, the wall having a port for providing a fluid path between a vacuum source and the outer concentric fluid flow passage through said fluid conduit, the vacuum source having a lower vacuum than the high vacuum in the envelope, the center concentric fluid flow passage being in a direct fluid flow path with the envelope interior and maintained approximately at the pressure of the envelope interior.

22. The apparatus of claim 21 wherein the apparatus includes three of said solid members to form first, second and third concentric fluid flow passages and first and second radially extending fluid conduits, the first, second and third concentric fluid flow passages being at progressively larger first, second and third radii from the beam axis, the first and third concentric fluid flow passages being respectively in direct fluid flow relation with the envelope interior and the vacuum source having the lower vacuum via the first radially extending fluid conduit, the wall including a second port, the second concentric fluid flow passage being in fluid flow relation with a vacuum source having a vacuum intermediate the high vacuum and the lower vacuum via the second radially extending fluid conduit and the second port.

23. The apparatus of claim 22 wherein the ports in fluid flow relation with the lower and intermediate vacuum sources are angularly displaced with respect to the beam axis.

24. The apparatus of claim 21 wherein each of the sleeves is shaped as a frusto-conical member tapered toward the beam axis and the workpiece, the frusto-conical member on the outermost and innermost members, respectively, having the shortest and greatest lengths along the beam axis.

25. The apparatus of claim 22 wherein said wall includes a third port and the third concentric fluid flow passage is in fluid flow relation with a high vacuum source via the third port.

* * * * *